United States Patent
Kodani et al.

(10) Patent No.: US 8,558,373 B2
(45) Date of Patent: Oct. 15, 2013

(54) HEATSINK, HEATSINK ASSEMBLY, SEMICONDUCTOR MODULE, AND SEMICONDUCTOR DEVICE WITH COOLING DEVICE

(75) Inventors: Kazuya Kodani, Kawasaki (JP); Makoto Takeda, Kiyose (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/466,653

(22) Filed: May 8, 2012

(65) Prior Publication Data

US 2012/0217630 A1 Aug. 30, 2012

Related U.S. Application Data

(63) Continuation of application No. PCT/JP2009/069187, filed on Nov. 11, 2009.

(51) Int. Cl.
H01L 23/36 (2006.01)

(52) U.S. Cl.
USPC .......... 257/712; 257/706; 257/E23.101; 257/722

(58) Field of Classification Search
USPC .......... 257/706, 712, 722, E23.101
See application file for complete search history.

(56) References Cited

U.S. PATENT DOCUMENTS

| | | |
|---|---|---|
| 5,270,572 A | 12/1993 | Nakajima et al. |
| 5,729,995 A | 3/1998 | Tajima |
| 6,611,057 B2 | 8/2003 | Mikubo et al. |
| 7,139,172 B2 | 11/2006 | Bezama et al. |
| 2004/0182542 A1* | 9/2004 | Take et al. ............ 165/80.3 |

FOREIGN PATENT DOCUMENTS

| | | |
|---|---|---|
| JP | 05-003274 | 1/1993 |
| JP | 6-120387 A | 4/1994 |
| JP | 6-213588 A | 8/1994 |
| JP | 06-326226 | 11/1994 |
| JP | 07-066338 | 3/1995 |
| JP | 7-244008 A | 9/1995 |
| JP | 08-264695 A | 10/1996 |
| JP | 10-022428 | 1/1998 |
| JP | 2000-060106 A | 2/2000 |
| JP | 2001-223308 A | 8/2001 |
| JP | 2002-076224 A | 3/2002 |
| JP | 2002-151640 A | 5/2002 |

(Continued)

OTHER PUBLICATIONS

International Search Report issued Jan. 26, 2010 in PCT/JP2009/069187 filed Nov. 11, 2009 (with English Translation).

(Continued)

*Primary Examiner* — Roy Potter
(74) *Attorney, Agent, or Firm* — Oblon, Spivak, McClelland, Maier & Neustadt, L.L.P.

(57) ABSTRACT

According to one embodiment, a heatsink includes a base and heat radiation fins placed on one of surfaces of the base and arranged in parallel to each other with a submillimeter narrow pitch. Each of the multiple heat radiation fins has a submillimeter thickness, a length in a width direction of 60 mm or smaller, and a height of 40 mm or smaller. The heatsink assembly may be constituted by allaying a plurality of the heatsinks and thermally connecting each of the heatsinks to each other using a heat transport device.

14 Claims, 8 Drawing Sheets

(56) References Cited

FOREIGN PATENT DOCUMENTS

| | | |
|---|---|---|
| JP | 2003-167457 A | 6/2003 |
| JP | 2003-243593 A | 8/2003 |
| JP | 2004-95341 A | 3/2004 |
| JP | 2006-019730 A | 1/2006 |
| JP | 2008-278576 A | 11/2008 |
| JP | 2009-277699 A | 11/2009 |

OTHER PUBLICATIONS

Written Opinion Report issued Jan. 26, 2010 in PCT/JP2009/069187 filed Nov. 11, 2009.

Office Action issued Oct. 16, 2012 in Japanese Patent Application No. 2008-124836 (with English-language translation).

Japanese Office Action Issued May 8, 2012 in Patent Application No. 2008-124836 (with partial English translation).

* cited by examiner

Pf=Tf+Gf

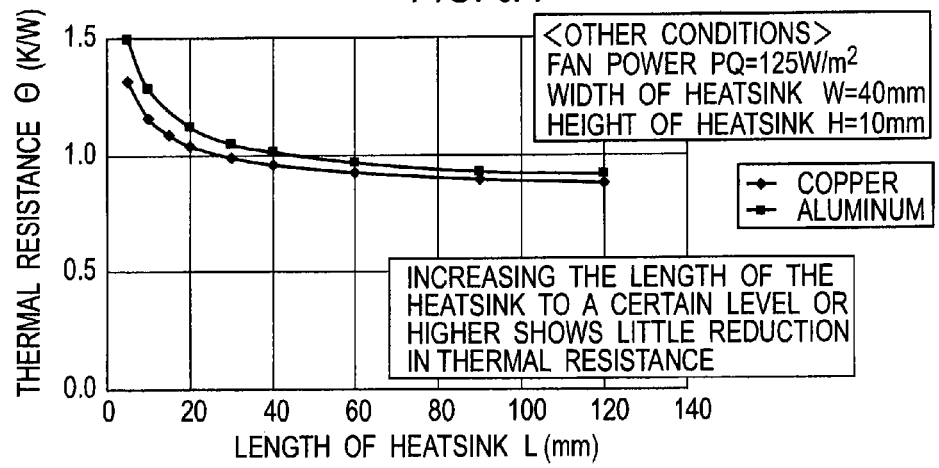
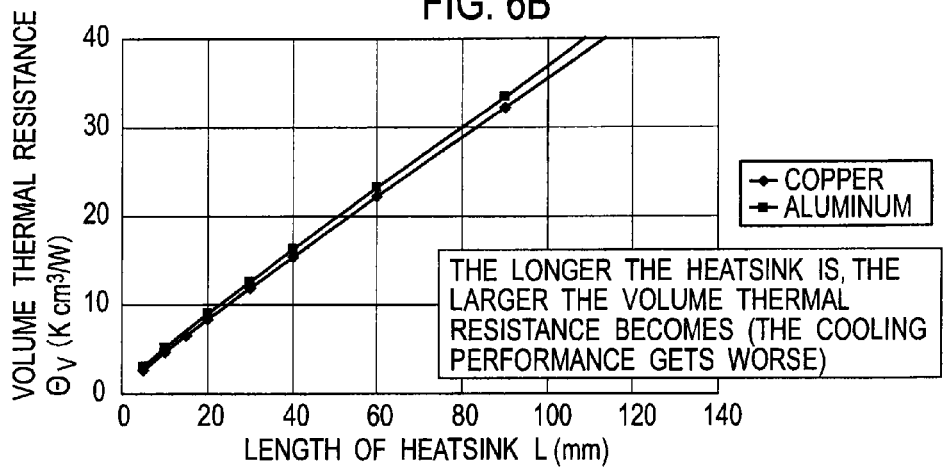
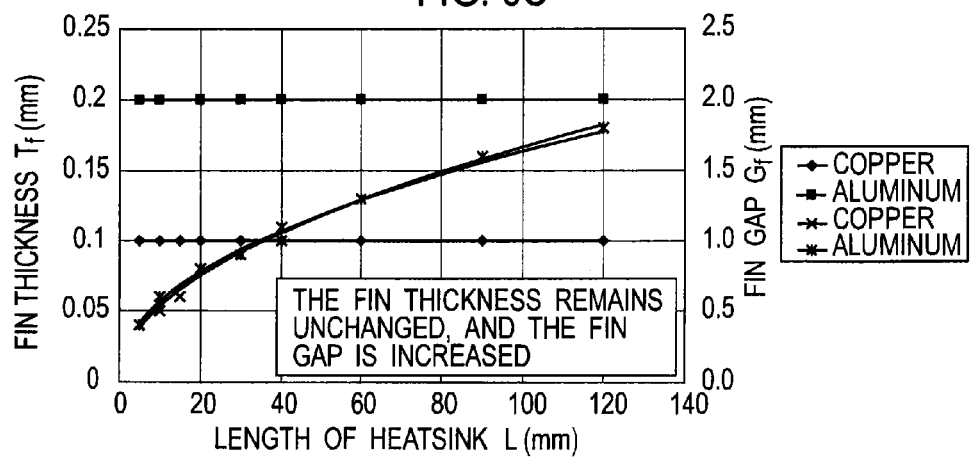

HEATSINK, HEATSINK ASSEMBLY, SEMICONDUCTOR MODULE, AND SEMICONDUCTOR DEVICE WITH COOLING DEVICE

CROSS-REFERENCE TO RELATED APPLICATIONS

This application is a Continuation of PCT Application No. PCT/JP2009/069187, filed on Nov. 11, 2009; the entire contents of which are incorporated herein by reference.

FIELD

Embodiments described herein relate generally to a heatsink, a heatsink assembly, a semiconductor module, and a semiconductor device with cooling device.

BACKGROUND

Generally, as illustrated in FIGS. 1 and 2, a cooling device for a power semiconductor device has a structure in which a heatsink 104 is brought into pressure contact with power semiconductor modules 101 by tightening bolts through an insulating material 102 and a thermal interface material 103 such as grease and a thermally conductive adhesive. Fans 105 are installed for forced air cooling to blow air in a direction along heat radiation fins 104B of the heatsink 104.

Heat generated in the power semiconductor device during an operation of a power converter is released into an ambient environment (atmosphere) from the power semiconductor modules 101 through the thermal interface material 103, which is a contact boundary, and a base 104A and heat radiation fins 104B of the heatsink 104.

However, in the case of the aforementioned forced-air cooling type cooling device for the power semiconductor device, a heat-transfer coefficient (several tens W/m²K) of the heatsink 104 which serves as a heat radiation part is low relative to a heat density (several hundred thousands W/m²) of the power semiconductor device, and, in order to keep the temperature difference within acceptable variation (several tens °C.), the radiation surface area needed to be expanded several hundred times the heated surface area.

In a process of expanding the surface area, there are factors which prevent heat radiation, including thermal conductivity resistance (thermal resistance due to heat conduction in a solid), contact thermal resistance (thermal resistance due to contact between solids), spreading thermal resistance (thermal resistance due to heat transfer from a heat generating component to the heatsink 104 while spreading at an angle of 45 degrees), a fm efficiency (a correction factor for a non-uniform temperature of the entire heat radiation fins 104B), a heatsink efficiency (a correction factor for a non-uniform temperature of incoming and outgoing air). Therefore, the volume of the heatsink 104 has been much larger than that of the power semiconductor module 101.

A power exchanger illustrated in FIG. 1 constructed of a large IGBT module and a cooling device will be described as an example of a conventional cooling device of a power semiconductor device. If a heat loss of the power semiconductor device is 2000 W and an acceptable junction temperature is 125° C. (ambient temperature of 40° C.), applying a large-sized caulking joint type heatsink 104 (W 330 mm×L 300 mm×H 110 mm) with forced air cooling fans 105 mounted thereon is one of reasonable solutions. At this time, since the thermal resistance of the heatsink 104 is 0.028 K/W and the volume of the same is 10890 cm³, the volume thermal resistance is 305 cm³ K/W (the performance index of the heatsink).

In order to reduce the volume of the heatsink 104, cooling means for efficient heat radiation is necessary. As one of such means, there is a heat-pipe type or vapor type cooler which transports heat by using latent heat and heat transfer due to evaporation condensation of a cooling medium, and a volume of a heatsink can be reduced by approximately a half to a third. This heatsink is widely used as a cooling device for an electric vehicle as well.

Another example of the means is a water-cooling type cooler which transports heat by means of forced circulation of a cooling medium using a pump. Yet another example is a cooler in which a micro channel is constructed right next to a heat generating component to reduce thermal conductivity resistance and the radiation surface area is expanded to reduce the surface thermal resistance to a cooling medium, so a flow rate of coolable heat is increased, thus enabling to cool a heat generating component with a high heat generation density. Also, there is a cooler which reduces a surface thermal resistance by using an impinging jet to obtain a similar effect.

However, in the conventional devices, even though a size of a heat receiving block can be reduced, a separate gas-liquid heat exchanger is needed to release heat into the ambient environment (atmosphere). So, the volume of the water-cooling type cooing device including peripherals (a driving pump, a tube, and the like) becomes equal to or larger than that of a heat-pipe or vapor type cooling device.

As explained above, in the conventional cooling devices of the power semiconductor device, a heat transport mechanism realized by circulation of a cooling medium is required. Therefore, the entire costs of a heatsink including a heat receiving block, a heat transport mechanism, and heat radiation fins have been increased. Further, in the conventional cooling devices of the power semiconductor device, since the heat receiving block and the heat radiation fins can be separated from each other, there is high layout flexibility. However, the volume of the entire cooling device including the heat receiving block, the heat transport mechanism, and the heat radiation fins is reduced by approximately a half or a third, which is not so small. It is also a problem that measures need to be taken to address possible issues such as freezing and leakage of a cooling medium.

BRIEF DESCRIPTION OF THE DRAWINGS

FIG. 4A is a front view thereof, and FIG. 4B is a side view thereof.

FIGS. 6A to 6C illustrate characteristics pertaining to the length of the heatsink according to Embodiment 1, where FIG. 6A illustrates the characteristics of thermal resistance, FIG. 6B illustrates the characteristics of volume thermal resistance, and FIG. 6C illustrates the characteristics of an optimum shape of the heat radiation fin.

FIG. 7A illustrates the characteristics of thermal resistance, FIG. 7B illustrates the characteristics of volume thermal resistance, and FIG. 7C illustrates characteristics of an optimum shape of the heat radiation fin.

FIG. 8A illustrates the characteristics of thermal resistance, FIG. 8B illustrates the characteristics of volume thermal resistance, and FIG. 8C illustrates the characteristics of an optimum shape of the heat radiation fin.

DETAILED DESCRIPTION

Figure 1:
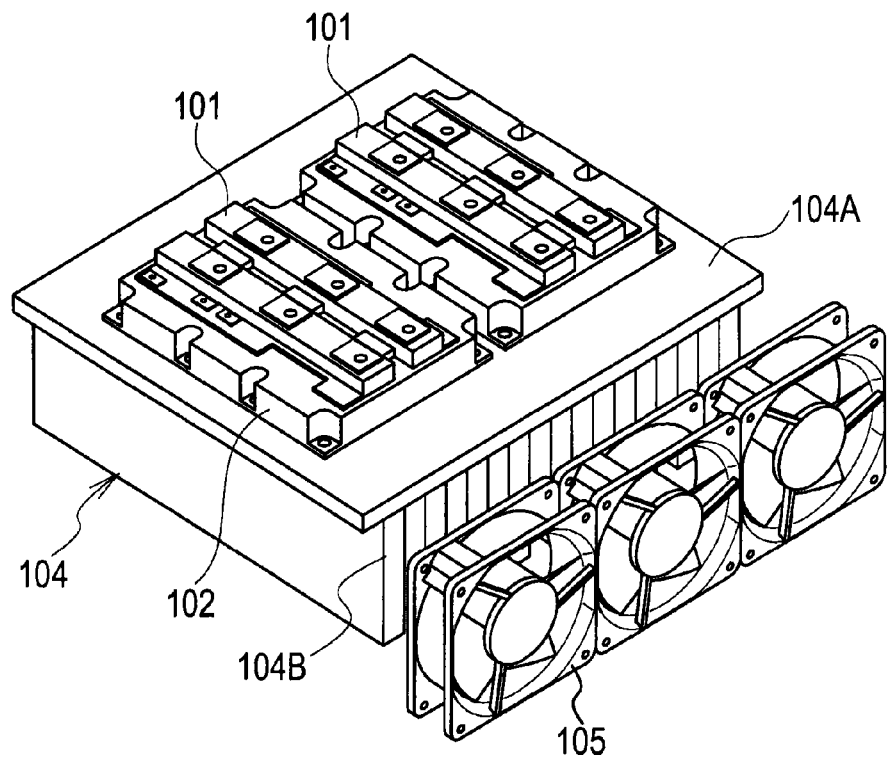
FIG. 1 is a perspective view of a conventional forced-air cooling type cooling device for a power semiconductor device.

According to one embodiment, a heatsink includes a base and heat radiation fins placed on one of surfaces of the base and arranged in parallel to each other with a submillimeter narrow pitch. Each of the multiple heat radiation fins has a submillimeter thickness, a length in a width direction of 60 mm or smaller, and a height of 40 mm or smaller. The heatsink assembly may be constituted by allaying a plurality of the heatsinks and thermally connecting each of the heatsinks to each other using a heat transport device.

First of all, the principle of the present invention will be explained. Once an outer shape (width: W, height: H, and length: L) of a heatsink and capability of a cooling fan are decided, a shape of a heat radiation fin which achieves the best possible heat radiation performance can be obtained from equations as below.

1) Flow Analysis

A hydraulic equivalent diameter D [m] having the length L [m] of the heatsink, the height $H_{fin}$ [m] of the heat radiation fin, and a rectangular duct with a gap g [m] is can be written.

$$D = 2gH_{fin}/(g+H_{fin}) \quad \text{[Math 1]}$$

A Reynolds number Re is obtained as follows from a fluid density $\rho$ [kg/m³], a fluid viscosity $\mu$ [Pa s], and an average flow velocity of the heat radiation fin $U_{ar}$ [m/s]:

$$Re = \rho D U_{ar}/\mu \quad \text{[Math 2]}$$

Although turbulent transition begins from a Reynolds number Re of approximately 2300, most heatsinks with a narrow fin pitch have a laminar flow. A non dimensional hydraulic distance $x^+$ is obtained as follows from a characteristic length x (the length L of the heatsink):

$$x^+ = x/(Re\, D) \quad \text{[Math 3]}$$

A friction coefficient f of a fully developed laminar flow is obtained as follows:

$$fRe = (19.64G + 4.7) \quad \text{[Math 4]}$$

Here, a channel aspect ratio G is obtained as follows:

$$G = [(g/H_{fin})^2 + 1]/[(g+H_{fin})+1]^2 \quad \text{[Math 5]}$$

and a friction coefficient $f_{app}$ of a developing laminar flow is obtained as follows:

$$f_{app}Re = \{[3.2(x^+)^{-0.57}]^2 + (fRe)^2\}^{1/2} \quad \text{[Math 6]}$$

An inlet length X till full development of the laminar flow is obtained as follows:

$$X/D = 0.0065 Re \quad \text{[Math 7]}$$

In this inlet length, there is an extra pressure loss.

Next, a contraction factor $K_c$, and an expansion factor $K_e$ are obtained. A fin density $\rho$ relative to a pitch interval p [m] of a heat radiation fin is obtained as follows:

$$\rho = g/p \quad \text{[Math 8]}$$

The contraction factor $K_c$ is obtained as follows:

$$K_c = 0.8 - 0.4\rho^2 \quad \text{[Math 9]}$$

The expansion factor $K_e$ is obtained as follows:

$$K_e = (1-\rho)^2 \quad \text{[Math 10]}$$

The pressure loss $\Delta P_{hs}$ [Pa] of the heatsink is obtained as follows:

$$\Delta P_{hs} = (K_c + 4f_{app}x^+ + K_e)H_{ar} \quad \text{[Math 11]}$$

Here, $H_{ar}$ [Pa] represents fin hydraulic head and is obtained from following equation:

$$H_{ar} = \rho U_{ar}^2/2 \quad \text{[Math 12]}$$

The volume flow rate V [m³/s] is obtained as follows from the width W [m] of the heatsink:

$$V = W\rho H_{fin} U_{ar} \quad \text{[Math 13]}$$

Fan power P [W] is equal to the volume flow rate times the pressure loss, and thus obtained as follows:

$$P = V\Delta P \quad \text{[Math 14]}$$

2) Heat-transfer Analysis

A Nusselt number Nu of a fully developed laminar flow of a rectangular duct is obtained as follows:

$$Nu = 8.31G - 0.02. $$

A non dimensional thermal channel length $x^*$ is obtained as follows where a Prandtl number is designated by Pr:

$$x^* = x/(Re\, D\, Pr) \quad \text{[Math 16]}$$

An average Nusselt number $Nu_m$ is obtained as follows:

$$Nu_m = \{[2.22(x^*)^{-0.33}]^3 + Nu^3\}^{1/3} \quad \text{[Math 17]}$$

An average heat transfer coefficient $h_m$ [W/m² K] is obtained as follows based on thermal conductivity of air $k_f$ [W/m K]:

$$h_m = Nu_m k_f/D \quad \text{[Math 18]}$$

A convective thermal resistance $\theta_{con}$ [K/W] of a heatsink is obtained as follows based on the surface area of the heatsink $A_w$ [m²]:

$$\theta_{con} = 1/(h_m A_w) \quad \text{[Math 19]}$$

The capacity heat resistance of a heatsink $\theta_{cap}$ [K/W] is obtained as follows from a specific heat capacity of air $c_p$ [J/kg K]:

$$\theta_{cap} = 1/(V\rho c_p) \quad \text{[Math 20]}$$

A number of heat transfer unit NTU used for a heat exchanger is obtained as follows:

$$NTU = h_m A_w/(V\rho c_p) \quad \text{[Math 21]}$$

A heatsink efficiency $\epsilon$ which indicates a ratio of real heat transfer to an ideal heat transfer is obtained as follows:

$$\epsilon = 1 - \exp(-NUT) \quad \text{[Math 22]}$$

A correction is made by fin efficiency $\eta$ as follows:

$$\eta = \tanh(b\, H_{fin})/(b\, H_{fin}) \quad \text{[Math 23]}$$

Here, b is obtained as follows from thermal conductivity of heat radiation fin $k_s$ [W/m K]:

$$b=[2h_m/(k_s t)]^{1/2} \quad \text{[Math 24]}$$

Thermal resistance $\theta_{hs}$ [K/W] of a heatsink is obtained as follows:

$$\theta_{hs}=\theta_{cap}/(\eta\epsilon) \quad \text{[Math 25]}$$

To have a shape of a heat radiation fin to achieve the best possible heat radiation performance based on results of the above calculations, it is understood that the length L of a heatsink does not need to exceed a certain length. This means that, although lengths of forced-air cooling type heatsinks for conventional power semiconductor devices are mostly between 200 mm and 300 mm, the same heat radiation performance can be realized with a heatsink length of 20 mm to 30 mm. This type of heatsink is superior in reduction of both the size and costs thereof.

The following Embodiments will be explained as examples of calculation results for optimizing the values of a heatsink length L [mm], a thickness of a heat radiation fin Tf [mm], and heat radiation fin gap Gf [mm] where a fan power PQ=0.05 [W], the heatsink width W=40 [mm], and the heatsink height H=10 [mm] (the base thickness=1 [mm]).

Embodiments of the present invention will be described below based on the drawings.

Embodiment 1

Figure 3:
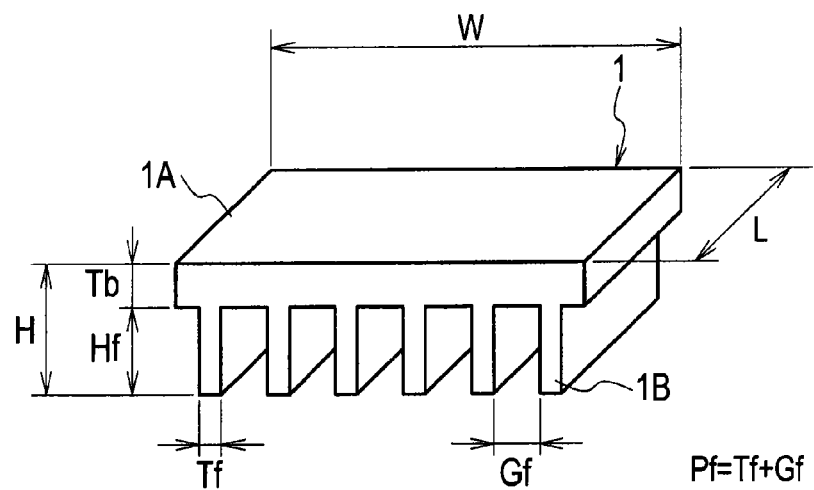
FIG. 3 is a perspective view of a heatsink according to Embodiment 1.
Figure 4A:
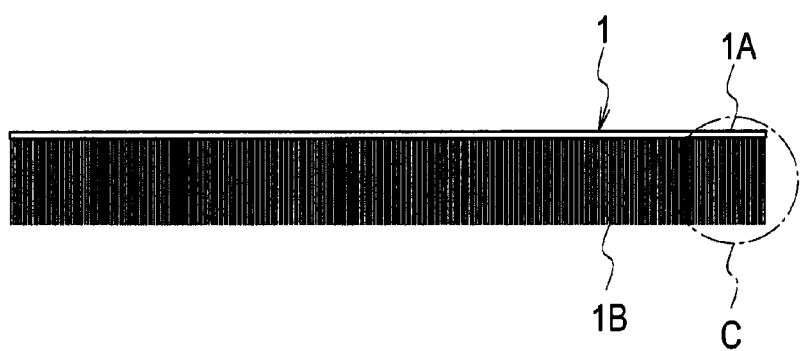
FIGS. 4A and 4B illustrate the heatsink according to Embodiment 1, where
Figure 4B:
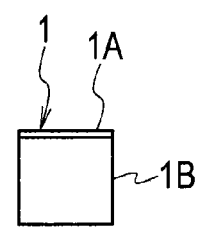
Figure 5:
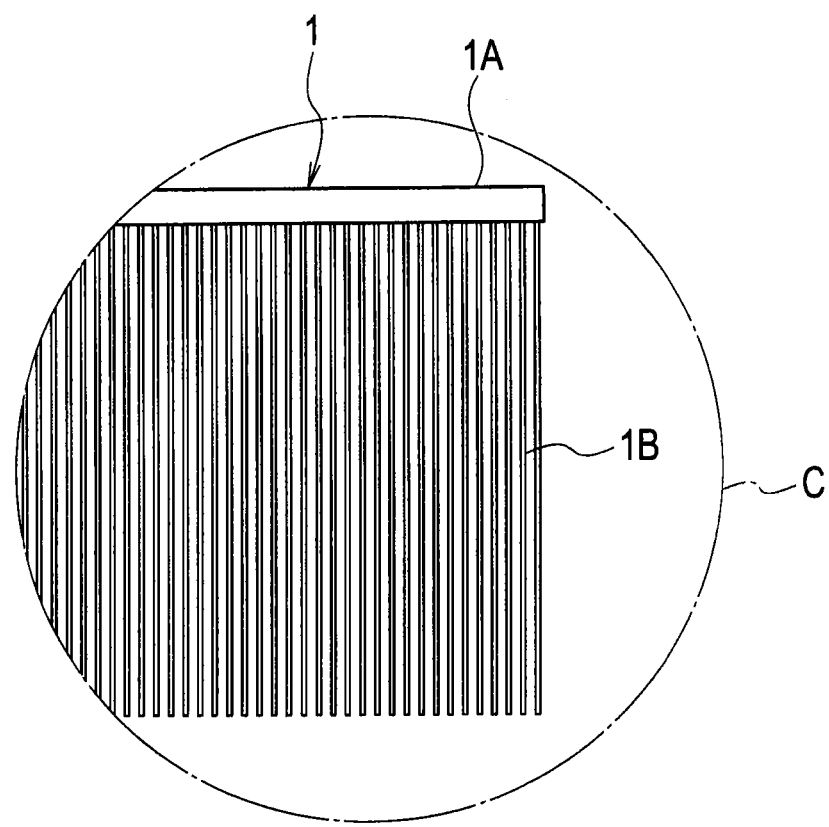
FIG. 5 is an enlarged view of section C in FIG. 4A.

FIGS. 3 to 5 illustrate a structure of a high-density heat radiation fin heatsink 1 for a power semiconductor device according to Embodiment 1. As illustrated in FIG. 3, the shape of the heatsink 1 is defined by the outer shape of the heatsink 1 which is equivalent to the width: W, the height: H, and the length: L thereof, a thickness of a cooling surface base 1A: Tb, and a thickness: Tf, a gap: Gf, and a height: Hf of each of heat radiation fins 1B. The width W of the heatsink 1 is a length in a direction where the heat radiation fins 1B are arranged in line. The length L of the heatsink 1 is in a direction along a flow of air from a fan, and is equal to the width of the heat radiation fin 1B.

As illustrated in FIGS. 4 and 5, each of the heat radiation fins 1B has a submillimeter thickness, and a number of the heat radiation fins 1B are arranged in parallel to each other at a narrow submillimeter pitch. Further, by reducing the length L and the height H of the heatsink 1, the following three effects are obtained.

First, by arranging a number of the heat radiation fins 1B having a submillimeter thickness at a narrow pitch in parallel to each other, a pressure loss of the heatsink 1 is increased, but the entire surface area of the heat radiation fins is increased, which achieves an effect equivalent to an increase of the length L of the heatsink. Therefore, in the heatsink 1 of Embodiment 1, the length L can be reduced substantially compared to that of the conventional heatsink, which enables size reduction thereof.

Secondly, by reducing the length L of the heatsink 1, a utilization ratio of a boundary inlet region (developing region) is increased. Therefore, the heatsink 1 of Embodiment 1 can have better heat radiation performance than a conventional heatsink.

The third effect is that downsizing of the heatsink 1 makes it possible to remove most factors that prevent heat radiation including the thermal conductivity resistance, the spreading thermal resistance, the fin efficiency, and the heatsink efficiency.

Figure 2:
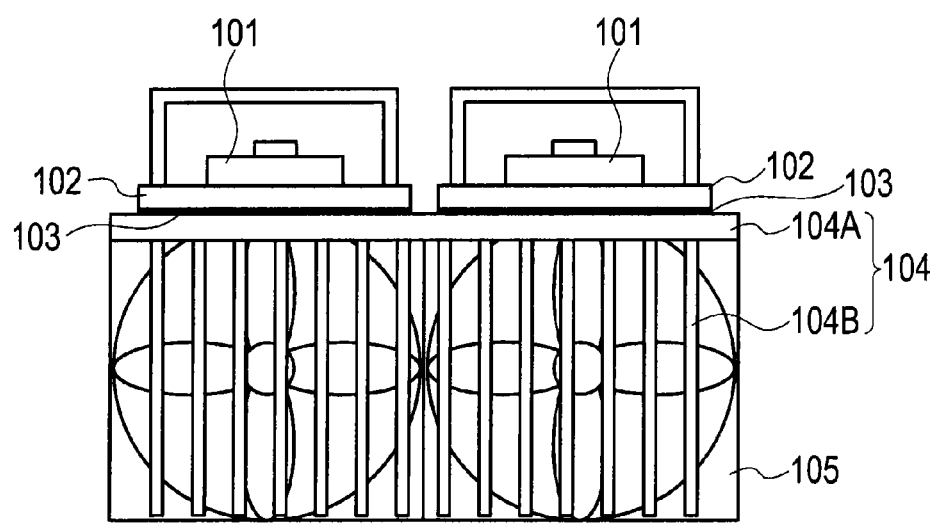
FIG. 2 is a cross-sectional view of the conventional forced-air cooling type cooling device of the power semiconductor device.

Next consideration is given to a case where a forced-air cooling type cooling device of a power semiconductor module is structured by using the fans 105 illustrated in FIGS. 1 and 2 where a fan power per unit area PQ=125 [W/m²]. FIGS. 6A to 6C illustrate calculations results of thermal resistance, volume thermal resistance, and an optimal shape of a heat radiation fm in the heatsink 1 having the width W=40 mm and the height H=10 mm where the length L of the heatsink is used as a function.

From these results, it is evident that, when an optimal shape of a heat radiation fin with a submillimeter thickness is employed, an increase of the length L of the heatsink to 60 mm or larger makes little contribution to reduction in thermal resistance as illustrated in FIG. 6A. Further, as illustrated in FIG. 6B, it is understood that, as the length L of the heatsink becomes larger, the volume thermal resistance which indicates cooling performance per volume becomes larger, in other words, the volume thermal resistance only gets worse. This proves that, in a case of a forced-air cooling type cooling device in which air is used as a fluid by using a commonly-used fan or blower, improvement of cooling performance can hardly be expected even if the length L of the heatsink 1 is increased to 60 mm or larger.

Figure 7A:
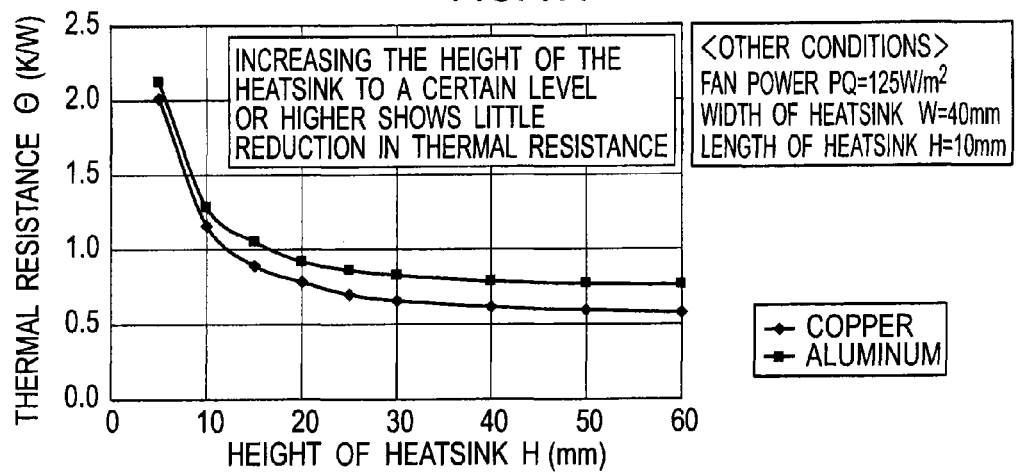
FIGS. 7A to 7C illustrate characteristics pertaining to the height of the heatsink according to Embodiment 1, where
Figure 7B:
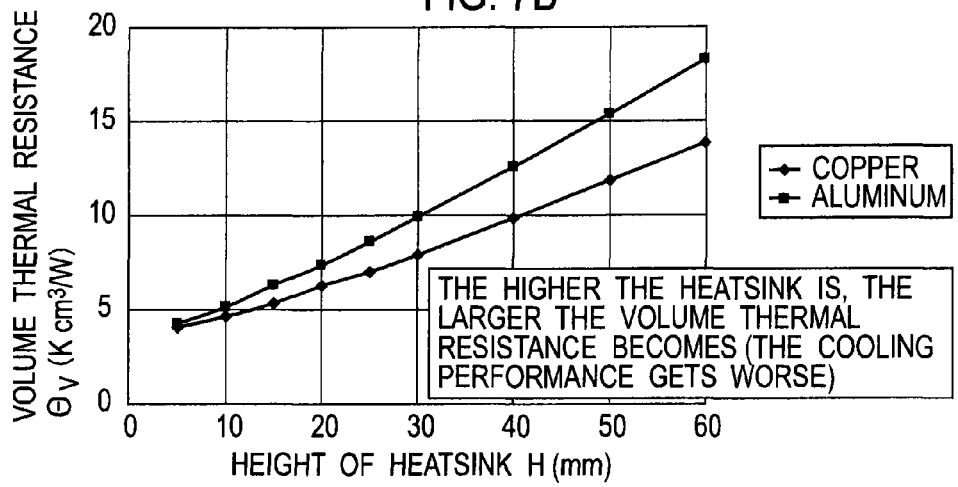
Figure 7C:
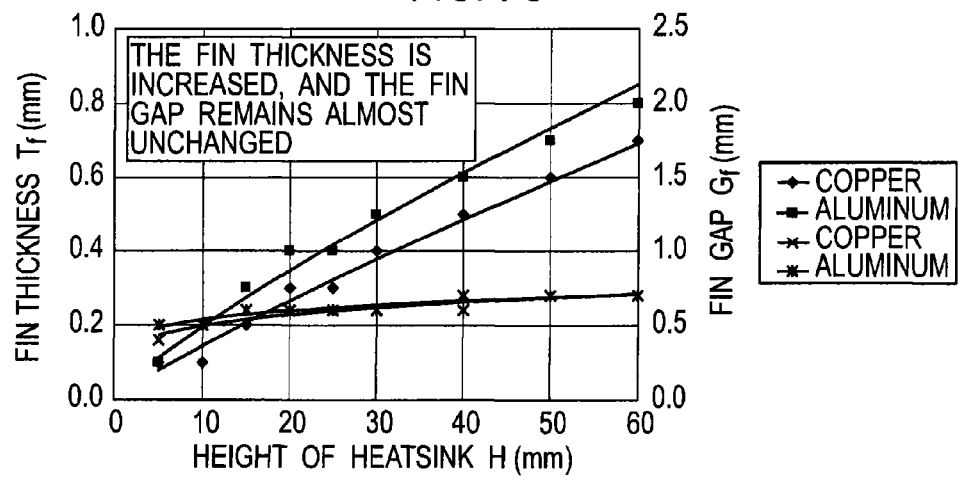

Similarly, FIGS. 7A to 7C illustrate calculation results of thermal resistance, volume thermal resistance, and an optimal shape of a heat radiation fm in the heatsink 1 having the width W=40 mm and the length L=10 mm where the height H of the heatsink is used as a function. From these results, it is understood that, an increase in the height H of the heatsink to 40 mm or larger makes little contribution to reduction in thermal resistance, and the volume thermal resistance is increased or only gets worse. This proves that improvement of cooling performance can hardly be expected even if the height H of the heatsink is increased to 40 mm or larger under general conditions.

Figure 8A:
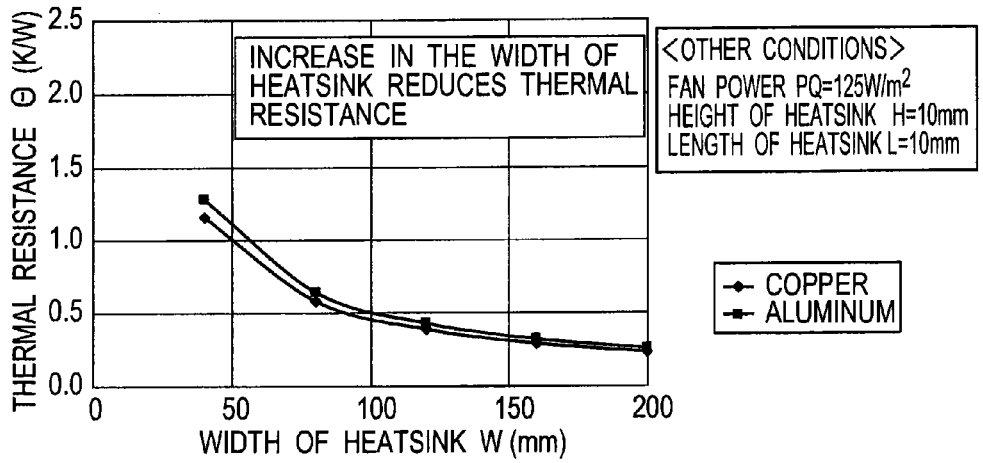
FIGS. 8A to 8C illustrate characteristics pertaining to the width of the heatsink according to Embodiment 1, where
Figure 8B:
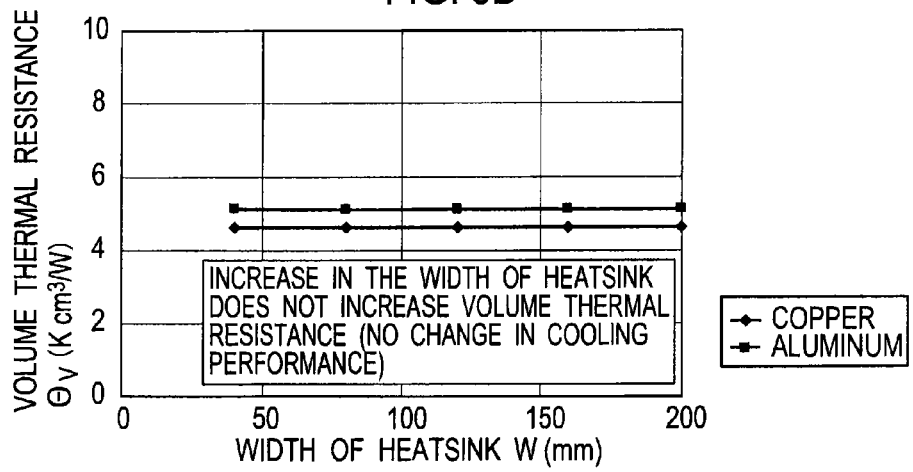
Figure 8C:
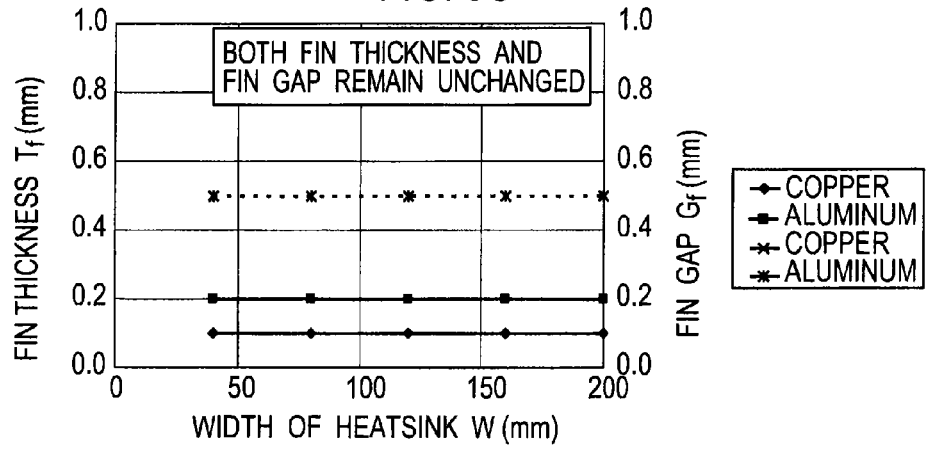

For reference, FIGS. 8A to 8C illustrate calculation results of thermal resistance, volume thermal resistance, and an optimal shape of a heat radiation fin in the heatsink 1 having the height H=10 mm and the length L=10 mm where the width W of the heatsink is used as a function. From these calculation results, it is found that the width W of a general heatsink 1 and thermal resistance have an inverse relationship.

In the case of the heatsink 1 according to Embodiment 1, the same performance as the conventional example of a cooling device for a power semiconductor module illustrated in FIGS. 1 and 2 can be realized with a high-density heat radiation fin heatsink (W330 mm×L15 mm×H15 mm×3P). Since the thermal resistance of the heatsink 1 is 0.028 K/W and the volume thereof is 223 cm³, the volume thermal resistance is 6.2 cm³ K/W. Therefore, with the heatsink according to Embodiment 1, the size thereof can be reduced by approximately a fiftieth compared to the conventional heatsink illustrated in FIGS. 1 and 2.

As described above, in the heatsink 1 according to Embodiment 1, each of the heat radiation fins 1B has a submillimeter thickness, the heat radiation fins 1B are structured with a narrow pitch, and the length L and the height H of the heatsink 1 are reduced. This makes it possible to reduce the volume of the heatsink 1 significantly, as well as to structure a highly reliable semiconductor cooling device at low cost since there is no heat transport mechanism with a circulating cooling medium.

Furthermore, there was no inexpensive way to structure the heat radiation fins 1B so that each of the heat radiation fins 1B has a submillimeter thickness and a number of heat radiation fins 1B are arranged parallel to each other with a narrow pitch. However, along with advancement of manufacturing technologies in recent years, it is possible to fabricate such a high-density heat radiation fm heatsink 1 according to Embodiment 1 by applying such technologies as high-precision press. Currently, material costs of a conventional large-sized caulking joint type heatsink and mass production costs of the high-density heat radiation fin heatsink according to Embodiment 1 are almost equal. As a result, as opposed to a conventional large-sized caulking joint type heatsink, the high-density heat radiation fm heatsink having a equal level of heat resistance can be provided at same costs and with a size reduced by a several tenth. Thus, if the material costs are increased in future, the high-density heat radiation fin heatsink according to Embodiment 1 will also be advantageous in terms of costs.

It is assumed that the high-density heat radiation fin heatsink 1 according to Embodiment 1 is used as a cooling device of a power semiconductor device such as an IGBT and a MOSFET, but may also be applied to any heat-generating semiconductor device such as a CPU and a resistor.

In the high-density heat radiation fm heatsink 1 according to Embodiment 1, since the heat radiation fins 1B have a submillimeter thickness and are arranged at a narrow pitch, there is a concern about the strength and contamination of the heat radiation fins. Hence, in such an environment, it is preferred to install an air filter to prevent contamination. To do so, an air filter may be installed in an air intake of the fan 105 when the fan is an induced draft fan. When the fan 105 is an exhaust fan, an air filter may be installed in an air intake on the opposite side of the fan-installed side of a case in which a cooling device is accommodated.

Embodiment 2

Figure 9:
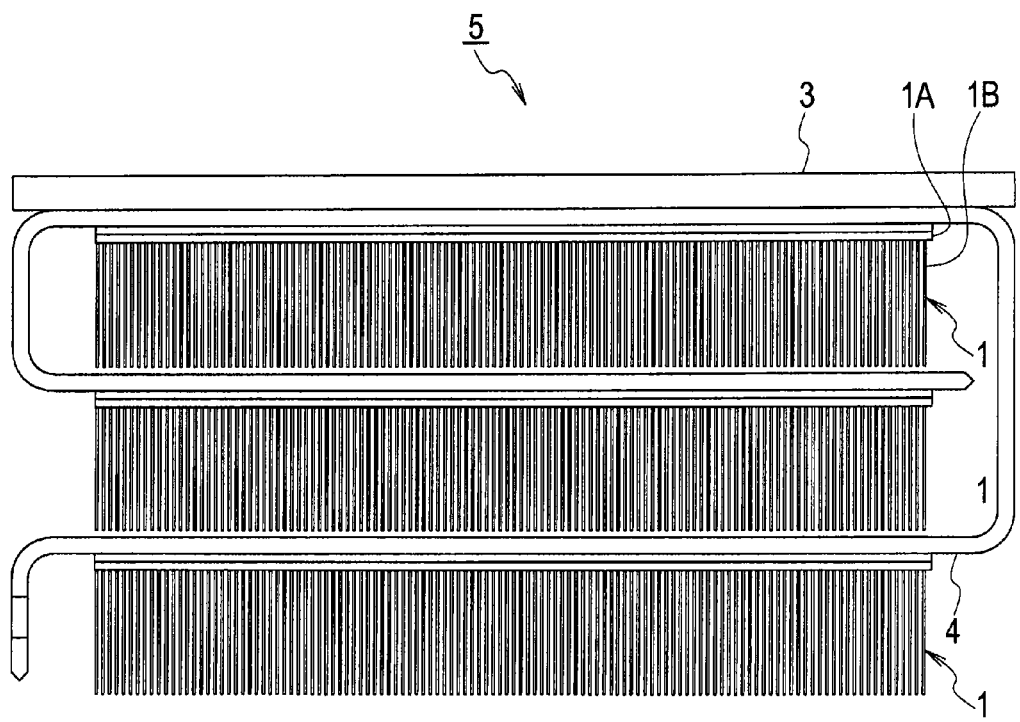
FIG. 9 is a front view of a heatsink assembly according to Embodiment 2.

A heatsink assembly 5 according to Embodiment 2 will be explained with reference to FIG. 9. The heatsink assembly 5 according to Embodiment 2 has a structure in which the high-density heat radiation fin heatsinks 1 according to Embodiment 1 are connected to each other in the height direction by a heat transport device 4 such as a heat pipe and heat lane, and a heat receiving block 3 is installed on a heat receiving surface. Here, the heat receiving surface means one of the surfaces of a base 1A on which the heat radiation fins 1B are not arranged.

As illustrated in FIGS. 7A to 7C, in the case of the high-density heat radiation fin heatsink 1, the cooling performance thereof is not improved even if the height H of the heatsink is increased to a certain level or higher. Having said that, by using the heat transport device 4 like the heatsink assembly 5 according to Embodiment 2, an increase in volume thermal resistance due to an increase in the height H of a single piece of the heatsink 1 can be eliminated, thus enabling to improve the cooling performance.

Similarly to the heatsink 1 according to Embodiment 1, the heatsink assembly 5 according to Embodiment 2 can also be used as a forced-air cooling type cooling device for a semiconductor device, and as a forced-air cooling type cooling device for a semiconductor module.

Embodiment 3

Figure 10:
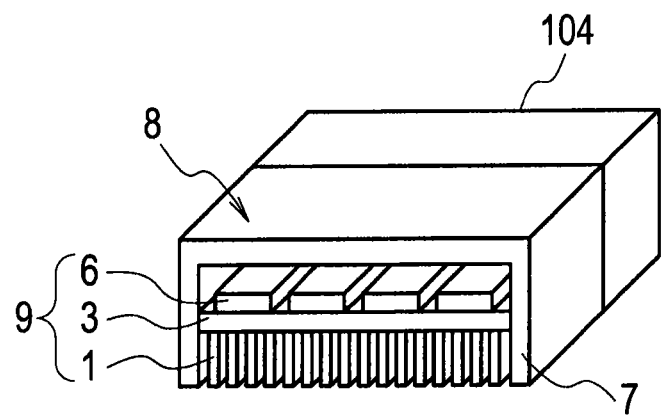
FIG. 10 is a partially sectional perspective view of a semiconductor device with a cooling device according to Embodiment 3.

A semiconductor device 8 with a cooling device according to Embodiment 3 will be explained with reference to FIG. 10. The semiconductor device 8 with a cooling device according to Embodiment 3 constructs a power semiconductor module 9 by placing the heat receiving block 3 on the heat receiving surface of the base 1A of the high-density heat radiation fin heatsink 1 according to Embodiment 1, and by fixing power semiconductor devices 6 on the heat receiving block 3. The entire power semiconductor module 9 is mounted inside a case 7. Then, the air-cooling fans 105 are attached to the case 7 similarly to those illustrated in FIGS. 1 and 2.

In the semiconductor device 8 with a cooling device according to Embodiment 3, the power semiconductor devices 6 and the heatsinks 1 are electrically connected to each other, and the heatsinks 1 are used as a part of an electrode terminal.

Embodiment 4

Figure 11:
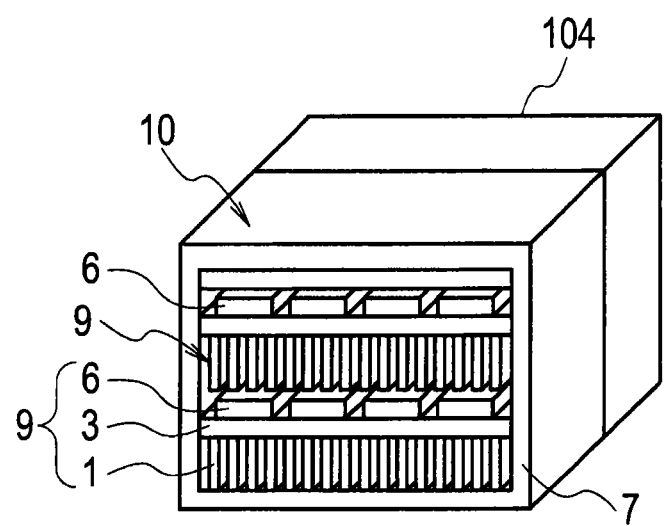
FIG. 11 is a partially sectional perspective view of a semiconductor device with a cooling device according to Embodiment 4.

A semiconductor device 10 with a cooling device according to Embodiment 4 will be described with reference to FIG. 11. The semiconductor device 10 with a cooling device according to Embodiment 4 structures the power semiconductor module 9 by mounting the high-density heat radiation fin heatsinks 1 according to Embodiment 1 inside the case 7, and by fixing the power semiconductor devices 6 on the heat receiving surface of the heat block 3 of each of the high-density heat radiation fin heatsinks 1. Then, the power semiconductor modules 9 are embedded in the case 7 in a multi-stage fashion, and air-cooling fans 105 are attached the case 7 similarly to those illustrated in FIGS. 1 and 2.

Similarly to Embodiment 3, in the semiconductor device 10 with a cooling device according to Embodiment 4, each of the power semiconductor devices 6 and the heatsinks 1 are electrically connected to each other, and the heatsinks 1 are used as a part of an electrode terminal.

In Examples 3 and 4, the high-density heat radiation fin heatsinks 1 may be placed on both surfaces of the power semiconductor devices 6, and each of the heatsinks 1 may receive heat of the power semiconductor devices 6 by means of solder joint, pressure contact, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A heatsink used with a forced-air cooling fan, comprising:
   a base; and
   heat radiation fins placed on one of surfaces of the base and arranged in parallel to each other with a gap in a range of 0.4 to 1.3 mm, wherein
   each of the heat radiation fins has a thickness in a range of 0.1 to 0.6 mm, a length in a width direction in a range of 5 to 20 mm, and a height in a range of 5 to 40 mm.

2. A heatsink assembly, comprising:
   two or more heatsinks, each comprising a base, and heat radiation fins placed on one of surfaces of the base and arranged in parallel to each other with a gap in a range of 0.4 to 1.3 mm, each of the heat radiation fins having a thickness in a range of 0.1 to 0.6 mm, a length in a width direction in a range of 5 to 20 mm, and a height in a range of 5 to 40 mm; and
   a heat transport device which thermally connect the heatsinks to each other.

3. A semiconductor module, comprising:
   a heatsink comprising a base, and heat radiation fins placed on one of surfaces of the base and arranged in parallel to each other with a gap in a range of 0.4 to 1.3 mm, each of the heat radiation fins having a thickness in a range of 0.1 to 0.6 mm, a length in a width direction in a range of 5 to 20 mm, and a height in a range of 5 to 40 mm;

a heat receiving block placed on the other surface of the base in a thermally-conductive state; and a semiconductor device placed on the heat receiving block.

4. A semiconductor module, comprising:

a heatsink assembly comprising two or more heatsinks, each comprising a base, and heat radiation fins placed on one of surfaces of the base and arranged in parallel to each other with a gap in a range of 0.4 to 1.3 mm, each of the heat radiation fins having a thickness in a range of 0.1 to 0.6 mm, a length in a width direction in a range of 5 to 20 mm, and a height in a range of 5 to 40 mm, and a heat transport device which thermally connects the heatsinks to each other, a heat receiving block placed on the other surface of the base in a thermally-conductive state relative to at least one of the heatsinks of the heatsink assembly; and a semiconductor device placed on the heat receiving block.

5. The semiconductor module according to claim 3 in which the semiconductor device is a power semiconductor device.

6. The semiconductor module according to claim 3 wherein the heatsink is used as an electrode terminal.

7. A cooler-mounted semiconductor apparatus, comprising:

a semiconductor module comprising a heatsink comprising a base, and heat radiation fins placed on one of surfaces of the base and arranged in parallel to each other with a gap in a range of 0.4 to 1.3 mm, each of the heat radiation fins having a thickness in a range of 0.1 to 0.6 mm, a length in a width direction in a range of 5 to 20 mm, and a height in a range of 5 to 40 mm;

a heat receiving block placed on the other surface of the base in a thermally-conductive state; and a semiconductor device placed on the heat receiving block;

a case in which the semiconductor module is accommodated; and a fan which is attached to the case and blows air to the heat radiation fins of the semiconductor module.

8. A cooler-mounted semiconductor apparatus, comprising:

a semiconductor module comprising a heatsink assembly comprising two or more heatsinks, each comprising a base, and heat radiation fins placed on one of surfaces of the base and arranged in parallel to each other with a gap in a range of 0.4 to 1.3 mm, each of the heat radiation fins having a thickness in a range of 0.1 to 0.6 mm, a length in a width direction in a range of 5 to 20 mm, and a height in a range of 5 to 40 mm, and a heat transport device which thermally connects the heatsinks to each other, a heat receiving block placed on the other surface of the base in a thermally-conductive state relative to at least one of the heatsinks of the heatsink assembly; and a semiconductor device placed on the heat receiving block;

a case in which the semiconductor module is accommodated; and a fan which is attached to the case and blows air to the heat radiation fins of the semiconductor module.

9. The cooler mounted semiconductor apparatus according to claim 7 wherein an air intake is formed to suction air into the case, and an air filter is provided in the air intake.

10. The cooler mounted semiconductor apparatus according to claim 7 wherein the semiconductor device constitutes a power converter.

11. The cooler-mounted semiconductor apparatus according to claim 8, wherein an air intake is formed to suction air into the case, and an air filter is provided in the air intake.

12. The cooler-mounted semiconductor apparatus according to claim 8, wherein the semiconductor device constitutes a power converter.

13. The semiconductor module according to claim 4 in which the semiconductor device is a power semiconductor device.

14. The semiconductor module according to claim 4 wherein the heatsink is used as an electrode terminal.

\* \* \* \* \*